(12) United States Patent
Long et al.

(10) Patent No.: US 12,002,851 B2
(45) Date of Patent: Jun. 4, 2024

(54) SEMICONDUCTOR STRUCTURE AND METHOD OF FABRICATING THE SAME

(71) Applicant: Diodes Incorporated, Plano, TX (US)

(72) Inventors: Tao Long, Shanghai (CN); Pin-Hao Huang, Taipei (TW); Ze Rui Chen, Milpitas, CA (US)

(73) Assignee: Diodes Incorporated, Plano, TX (US)

( * ) Notice: Subject to any disclaimer, the term of this patent is extended or adjusted under 35 U.S.C. 154(b) by 168 days.

(21) Appl. No.: 17/690,842

(22) Filed: Mar. 9, 2022

(65) Prior Publication Data

US 2023/0238430 A1     Jul. 27, 2023

(30) Foreign Application Priority Data

Jan. 27, 2022 (CN) .......................... 202210102438.5

(51) Int. Cl.
    *H01L 29/06*      (2006.01)
    *H01L 29/04*      (2006.01)
    *H01L 29/66*      (2006.01)

(52) U.S. Cl.
    CPC .......... *H01L 29/0684* (2013.01); *H01L 29/04* (2013.01); *H01L 29/66121* (2013.01)

(58) Field of Classification Search
    CPC ................. H01L 29/0684; H01L 29/04; H01L 29/66121; H01L 29/0603; H01L 29/8613; H01L 23/3171; H01L 23/3185; H01L 23/3192; H01L 29/0692; H01L 29/66128; H01L 29/66272; H01L 29/7325; H01L 29/66136; H01L 2924/12036; H01L 29/8611; H01L 29/6603; H01L 29/6606; H01L 29/66204; H01L 33/0008
See application file for complete search history.

(56) References Cited

U.S. PATENT DOCUMENTS

2009/0020765 A1   1/2009   Miura
2021/0074849 A1*   3/2021   Kinoshita ........... H01L 29/0878

FOREIGN PATENT DOCUMENTS

TW         396505 B     7/2000
TW     201338184 A     9/2013

OTHER PUBLICATIONS

Office Action for Taiwan Application No. 111115745, mailed Mar. 8, 2023, 7 Pages.

* cited by examiner

*Primary Examiner* — Mohammad A Rahman
(74) *Attorney, Agent, or Firm* — AP3 Law Firm PLLC

(57) ABSTRACT

A semiconductor structure includes a substrate having a first surface and a second surface opposite to the first surface. The semiconductor structure also includes a first diffusion layer disposed in the substrate and adjacent to the first surface, and a first electrode layer disposed on the first diffusion layer. The semiconductor structure further includes a second diffusion layer disposed in the substrate and adjacent to the second surface, and a plurality of diffusion regions disposed in the second diffusion layer. The semiconductor structure further includes a second electrode layer disposed on the second diffusion layer and in contact with the plurality of diffusion regions. The second diffusion layer is coupled to the plurality of diffusion regions through the second electrode layer. The substrate is sandwiched between the first electrode layer and the second electrode layer.

19 Claims, 14 Drawing Sheets

SEMICONDUCTOR STRUCTURE AND METHOD OF FABRICATING THE SAME

PRIORITY

This application claims the benefit of and priority to Chinese Patent Application No. 202210102438.5, filed Jan. 27, 2022, which is hereby incorporated by reference in its entirety.

TECHNICAL FIELD

The present invention relates to a semiconductor structure and method of fabricating the same, and more particularly, to a semiconductor structure having a plurality of diffusion regions.

BACKGROUND

In a flyback converter circuit, the diode in a Resistor-Capacitor-Diode (RCD) circuit usually needs to have a higher conduction speed and a larger reverse recovery charge to suppress or slow down voltage spikes and circuit oscillations caused by the leakage inductance of the transformer. If a general fast recovery diode (FRD) is used, it may not be able to turn on quickly to transfer energy to the capacitor, thereby resulting in voltage spikes and circuit oscillations, and even affecting the overall circuit efficiency.

In the prior art, a bipolar junction transistor (BJT) can also be used. In particular, the base and the emitter of the BJT are short-circuited. After the base and the emitter have shorted together, the BJT is used as a diode element in the RCD circuit to improve the efficiency of the circuit. However, the manufacturing process of the BJT is complex and the cost is higher.

SUMMARY

Embodiments of the present disclosure relate to a semiconductor structure. The semiconductor structure includes a substrate having a first conductivity type. The substrate has a first surface and a second surface opposite to the first surface. The semiconductor structure also includes a first diffusion layer having the first conductivity type disposed in the substrate and adjacent to the first surface of the substrate. The semiconductor structure has a first electrode layer disposed on the first diffusion layer. The semiconductor structure further includes a second diffusion layer having a second conductivity type disposed in the substrate and adjacent to the second surface. The semiconductor structure further includes a plurality of diffusion regions having the first conductivity type and disposed in the second diffusion layer. The semiconductor structure further includes a second electrode layer disposed on the second diffusion layer and in contact with the plurality of diffusion regions such that the second diffusion layer is coupled to the plurality of diffusion regions through the second electrode layer, and the substrate is between the first electrode layer and the second electrode layer.

Embodiments of the present disclosure relate to a method of fabricating a semiconductor structure. The method includes providing a substrate of a first conductivity type having a first surface and a second surface opposite to the first surface. The method also includes diffusing into the substrate from the first surface of the substrate to form a first diffusion layer having the first conductivity type, and diffusing from the second surface of the substrate into the substrate to form a second diffusion layer having a second conductivity type. The method further includes forming a plurality of diffusion regions having the first conductivity type in the second diffusion layer, and forming a first electrode layer on the first diffusion layer. The method also includes forming a second electrode layer on the second diffusion layer, the second electrode layer in contact with the plurality of diffusion regions such that the second diffusion layer is coupled to the plurality of diffusion regions through the second electrode layer, and the substrate is between the first electrode layer and the second electrode layer.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
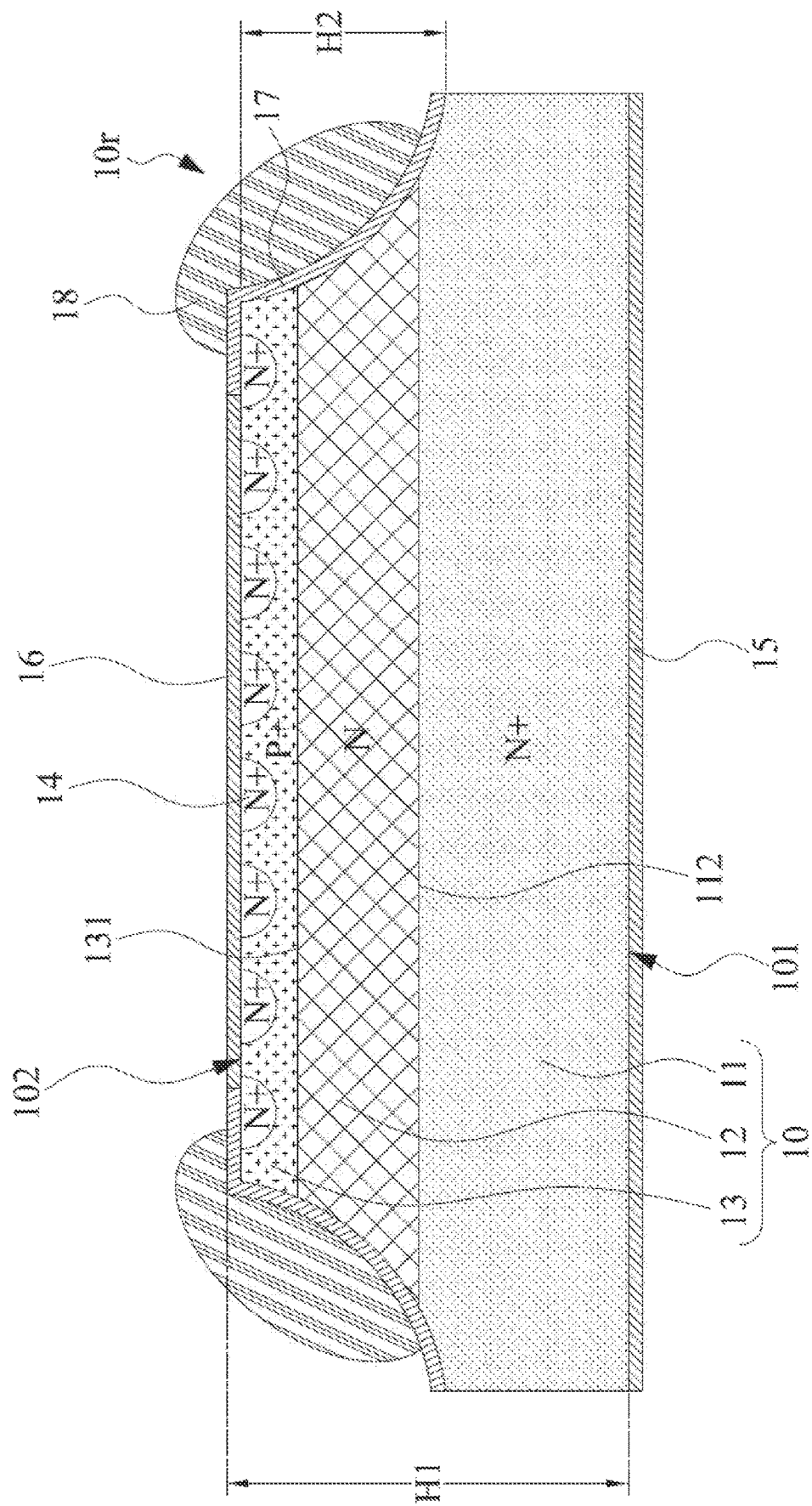
FIG. 1 shows a cross-sectional view of a semiconductor structure 1 in accordance with various embodiments of the present disclosure.

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The following disclosure provides many different embodiments or examples for implementing different features of the provided subject matter. Specific examples of components and configurations are described below. Of course, these are examples only and are not intended to be limiting. In this disclosure, forming a first feature on or over a second feature may encompass embodiments where the first feature is formed in direct contact with the second feature, and may also encompass embodiments where the first feature is formed not in direct contact with the second feature. Furthermore, the present disclosure may repeat reference numerals and/or letters in various embodiments. This repetition is for simplicity and clarity. The repetition, by itself, does not indicate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are illustrative only, and do not limit the scope of the disclosure.

The present disclosure provides a semiconductor structure and a method of fabricating the same. Compared with a general fast recovery diode (FRD), the semiconductor structure of the present disclosure has a structure similar to the NPN structure or the PNP structure of a bipolar junction transistor (BJT). The semiconductor structure has a higher turn-on speed and a short reverse recovery time. The semiconductor structure can effectively suppress or slow down voltage spikes and circuit oscillations. In addition, compared with general bipolar junction transistors, the method for fabricating the semiconductor structure of the present disclosure uses the double diffusion technique and the glass passivation parts technique. The method does not need to use the epitaxial growth technique, and need to use less mask layers. As a result, the process is simplified and the cost is lower.

Referring to FIG. 1, FIG. 1 shows a cross-sectional view of a semiconductor structure 1 in accordance with various embodiments of the present disclosure. The semiconductor structure 1 may include a substrate 10, electrode layers 15 and 16, a polysilicon layer 17 and a glass layer 18.

The substrate 10 may comprise a semiconductor substrate such as a silicon wafer. In some embodiments, the thickness H1 of the substrate 10 may be in a range from about 220 micrometers (μm) to about 240 μm. In some embodiments, the semiconductor structure 1 may be formed using an N-type single crystal silicon wafer having a volume resistivity in a range from about 30 Ohm-cm to about 45 Ohm-cm.

The substrate 10 may have a surface 101 and a surface 102 opposite to the surface 101. In some embodiments, the width of the surface 101 may be greater than the width of the surface 102 when viewed in a cross-sectional view. In some embodiments, the total surface area of the surface 101 may be greater than the total surface area of the surface 102.

In some embodiments, the substrate 10 may include a diffusion layer 11 adjacent to the surface 101, a diffusion layer 13 adjacent to the surface 102, and a core layer 12 between the diffusion layer 11 and the diffusion layer 13. The diffusion layer 13 can be equivalently used as a base, and the diffusion layer 11 can be equivalently used as a collector.

The core layer 12 can be a portion of the original silicon wafer. The core layer 12 can be doped with N-type impurities. As a result, the region is marked as an "N" region in FIG. 1.

The diffusion layer 11 may include a semiconductor layer doped with N-type impurities. The diffusion layer 11 and the core layer 12 may have the same conductivity type. However, the impurity concentration of the diffusion layer 11 may be higher than the impurity concentration of the core layer 12. As such, the diffusion layer 11 is marked as an "N+" region in FIG. 1. In some embodiments, the diffusion layer 11 may be formed by diffusing N-type impurities into the substrate 10 from the surface 101 of the substrate 10. The N-type impurities may include pentavalent elements such as phosphorus, arsenic and antimony. In some embodiments, a diffusion boundary 112 may be formed between the diffusion layer 11 and the core layer 12. In some embodiments, the diffusion boundary 112 is a boundary between a high concentration N-type impurity (N+) region and an N-type impurity (N) region. The impurity concentration in an "N+" region or a "P+" region used in this disclosure is higher than that in its adjacent regions.

The diffusion layer 13 may include a semiconductor layer doped with P-type impurities. The diffusion layer 13 and the core layer 12 may have opposite conductivity types. For example, a P-N junction may be formed between the diffusion layer 13 and the core layer 12. The impurity concentration of the diffusion layer 13 may be higher than the impurity concentration of the core layer 12. As such, the diffusion layer 13 is designated as a "P+" region as shown in FIG. 1. In some embodiments, the diffusion layer 13 may be formed by diffusing P-type impurities into the substrate 10 from the surface 102. P-type impurities may include trivalent elements such as boron, aluminum and gallium. In some embodiments, a diffusion boundary 131 may be formed between the diffusion layer 13 and the core layer 12. In some embodiments, the diffusion boundary 131 is a boundary between a high concentration P-type impurity (P+) region and an N-type impurity (N) region.

In some embodiments, the diffusion layer 13 may include a plurality of diffusion regions 14 separated from each other. The diffusion regions 14 and the diffusion layer 13 may have opposite conductivity types. For example, a P-N junction may be formed between each of the diffusion regions 14 and the diffusion layer 13. The impurity concentration of the diffusion regions 14 may be higher than the impurity concentration of the diffusion layer 13. As such, the diffusion regions 14 are designated as "N+" regions as shown in FIG. 1. In some embodiments, the impurity concentration of the diffusion regions 14 may be about ten times or more than ten times higher than the impurity concentration of the diffusion layer 13.

Diffusion regions 14 may be formed adjacent to surface 102. For example, diffusion regions 14 may be partially exposed from the surface 102. For example, the surface of each of the diffusion regions 14 may be coplanar with the surface 102 of the substrate 10. In this embodiment, the diffusion regions 14 do not extend to the diffusion boundary 131. In some embodiments, the distance (e.g., the shortest distance) between diffusion regions 14 and diffusion boundary 131 is at least greater than about 15 μm.

The electrode layer 15 may be disposed on the surface 101. For example, the electrode layer 15 may be disposed on the diffusion layer 11. The electrode layer 15 may contact or cover a portion of the diffusion layer 11. The electrode layer 15 may completely cover the surface 101. The electrode layer 15 can be regarded as an electrical terminal of the semiconductor structure 1. For example, the electrode layer 15 may be electrically connected to the electrical terminal of the semiconductor structure 1.

The electrode layer 16 may be disposed on the surface 102. The substrate 10 may be between the electrode layer 15 and the electrode layer 16. For example, the electrode layer 16 may be disposed on the diffusion layer 13. The electrode layer 16 may contact or cover a portion of the diffusion layer 13.

In some embodiments, the width of the electrode layer 15 may be greater than the width of the electrode layer 16 when viewed from a cross-sectional view. In some embodiments, the total surface area of the electrode layer 15 may be greater than the total surface area of the electrode layer 16.

In some embodiments, the exposed surface of one or more diffusion regions 14 from the surface 102 may be covered by the electrode layer 16. For example, the electrode layer 16 may contact or cover one or more diffusion regions 14. In some embodiments, the diffusion layer 13 may be coupled to each of diffusion regions 14 through the electrode layer 16. For example, the electrode layer 16 may be configured to short-circuit the diffusion layer 13 and each of diffusion regions 14. The diffusion layer 13 and each of the diffusion regions 14 can be regarded as an electrical terminal of the semiconductor structure 1. For example, the diffusion layer 13 and each of the diffusion regions 14 may be electrically connected to one electrical terminal of the semiconductor structure 1. The electrode layer 15 may be electrically connected to another electrical terminal of the semiconductor structure 1. Compared to the general BJT, the diffusion layer 13 and each of the diffusion region 14 can be short-circuited to each other without passing through other circuit elements, so as to achieve the effect of short-circuiting the base and the emitter. Once the base and the emitter is shorted, it can be used as the diode element in the RCD circuit.

In some embodiments, the electrode layer 15 and the electrode layer 16 may comprise copper (Cu), gold (Au), silver (Ag), aluminum (Al), nickel (Ni), titanium (Ti), tungsten (W), Tin (Sn), or other metals or alloys. In some embodiments, the electrode layer 15 and the electrode layer 16 may comprise the same material (e.g., aluminum). In some embodiments, the electrode layer 15 and the electrode layer 16 may comprise different materials. For example, the electrode layer 15 comprises aluminum, and the electrode layer 16 comprises silver, nickel, or titanium.

In some embodiments, the substrate 10 may include a groove ring 10r recessed downward or inward from the surface 102. The groove ring 10r may be located at the edge of the substrate 10. The groove ring 10r may surround the electrode layer 16. In some embodiments, the groove ring 10r may have an arc surface when viewed in a cross-sectional view. In some embodiments, the groove ring 10r may have a rectangular shape such as a square or a rectangle when viewed from a top view. The electrode layer 16 may be located in the rectangle. However, the semiconductor structure 1 of the present disclosure may have the groove ring 10r in any suitable shapes.

In some embodiments, the groove ring 10r may extend from the surface 102 down beyond the diffusion boundary 112 to achieve a higher breakdown voltage for the semiconductor structure. For example, the groove ring 10r may extend to the diffusion layer 11. A portion of the diffusion layer 11 may be exposed from the groove ring 10r. For example, the bottom of the groove ring 10r may be located in the diffusion layer 11. In some embodiments, the thickness H2 of groove ring 10r (e.g., the longest distance from surface 102 to the bottom of groove ring 10r) may be about 80 μm. In some embodiments, the thickness H2 of the groove ring 10r may be in a range from about 30% to about 50% of the thickness H1 of the substrate 10.

The polysilicon layer 17 may be disposed on the groove ring 10r. The polysilicon layer 17 may be located at the edge of the substrate 10. The polysilicon layer 17 may surround the electrode layer 16. The polysilicon layer 17 may include semi-insulating polycrystalline-silicon (SIPOS). In some embodiments, the polysilicon layer 17 may contact or cover the surface of the groove ring 10r. In some embodiments, the polysilicon layer 17 may completely contact or cover the surface of the groove ring 10r. In some embodiments, the polysilicon layer 17 may contact or cover a portion of the diffusion layer 11. In some embodiments, polysilicon layer 17 may contact or cover a portion of the core layer 12. In some embodiments, the polysilicon layer 17 may contact or cover a portion of the diffusion layer 13.

In some embodiments, the polysilicon layer 17 may contact or cover a portion of surface 102. In some embodiments, the polysilicon layer 17 may contact or cover a portion of one or more diffusion regions 14. In some embodiments, the polysilicon layer 17 may extend from the groove ring 10r toward the electrode layer 16 and contact an edge of the electrode layer 16. In some embodiments, the polysilicon layer 17 and the electrode layer 16 may be coplanar. In some embodiments, the thickness of the polysilicon layer 17 may be greater than the thickness of the electrode layer 16. In some embodiments, the thickness of the electrode layer 16 may be greater than the thickness of the polysilicon layer 17.

The glass layer 18 may be disposed over the groove ring 10r and the polysilicon layer 17. The polysilicon layer 17 may be located between the glass layer 18 and the groove ring 10r. The glass layer 18 may be located at the edge of the substrate 10. The glass layer 18 may surround the electrode layer 16. In some embodiments, the glass layer 18 may fill the groove ring 10r. In some embodiments, the glass layer 18 may fully fill the groove ring 10r. In some embodiments, the glass layer 18 may contact or cover a portion of polysilicon layer 17.

In some embodiments, the glass layer 18 may cover a portion of the surface 102. In some embodiments, the glass layer 18 may cover a portion of the diffusion regions 14. In some embodiments, the glass layer 18 may cover a portion of the diffusion layer 13. In some embodiments, the glass layer 18 may cover a portion of the core layer 12. In some embodiments, the glass layer 18 may cover a portion of the diffusion layer 11.

In some embodiments, the glass layer 18 may be separated from the surface 102 by the polysilicon layer 17. In some embodiments, the glass layer 18 may be separated from the diffusion regions 14 by the polysilicon layer 17. In some embodiments, the glass layer 18 may be separated from the diffusion layer 13 by the polysilicon layer 17. In some embodiments, the glass layer 18 may be separated from the core layer 12 by the polysilicon layer 17. In some embodiments, the glass layer 18 may be separated from the diffusion layer 11 by the polysilicon layer 17. In some embodiments, the glass layer 18 may not contact the electrode layer 16.

Figure 2:
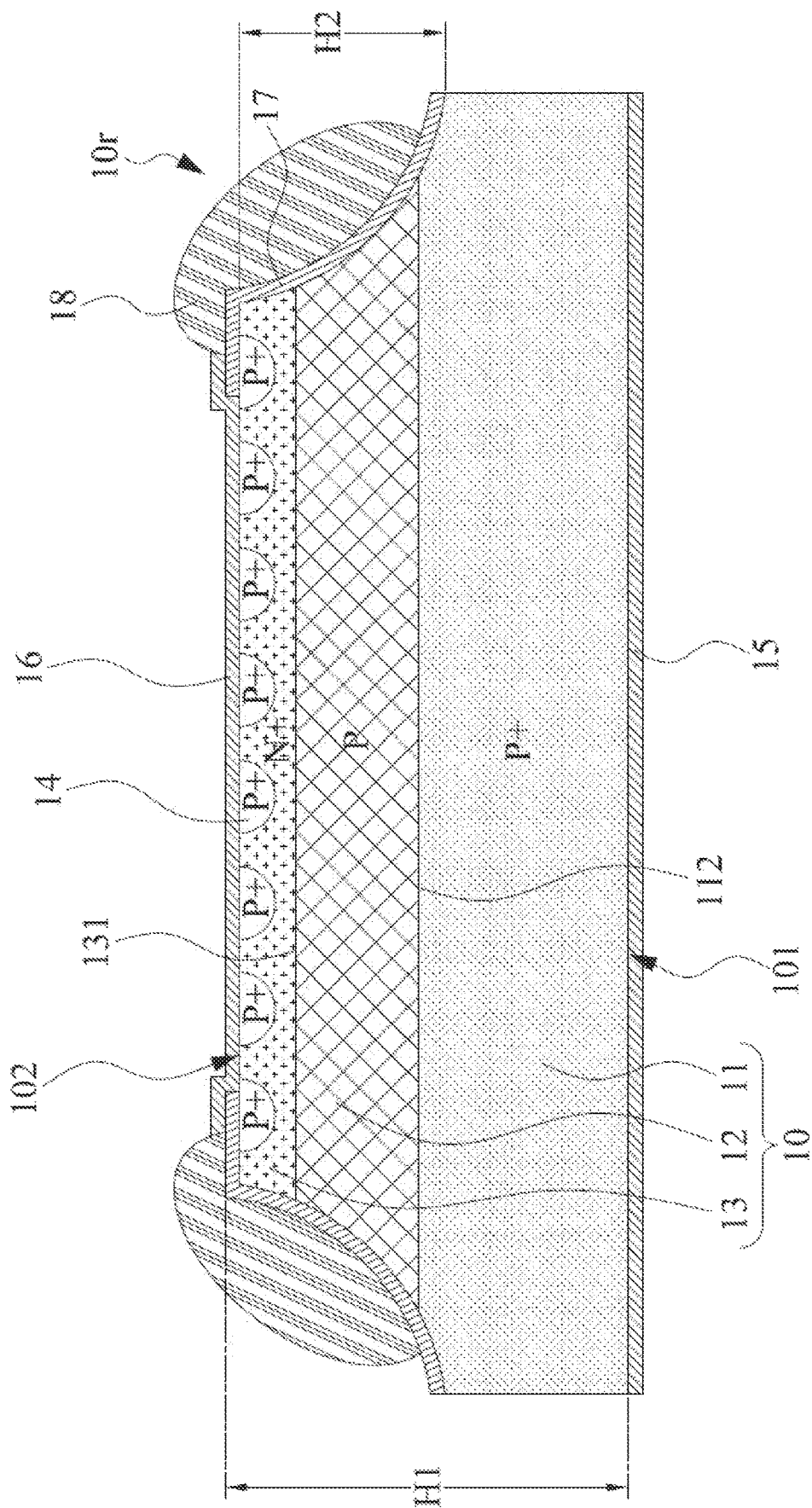
FIG. 2 shows a cross-sectional view of a semiconductor structure 2 in accordance with various embodiments of the present disclosure.

Referring to FIG. 2, FIG. 2 shows a cross-sectional view of a semiconductor structure 2 in accordance with various embodiments of the present disclosure. The same or similar elements of the semiconductor structure 2 shown in FIG. 2 and the semiconductor structure 1 shown in FIG. 1 are denoted by the same reference numerals, and the detailed description of the elements will not be repeated.

The conductivity type of the semiconductor structure 2 may be opposite to that of the semiconductor structure 1. The semiconductor structure 2 may use a semiconductor substrate doped with P-type impurities. The core layer 12 may be a portion of the original P-type monocrystalline silicon wafer. As such, the core layer 12 is marked as a "P" region in FIG. 2. The diffusion layer 11 may include a semiconductor layer doped with P-type impurities. The diffusion layer 11 and the core layer 12 may have the same conductivity type. However, the impurity concentration of the diffusion layer 11 may be higher than the impurity concentration of the core layer 12. As such, the diffusion layer 11 is marked as a "P+" region in FIG. 2.

The diffusion layer 13 may include a semiconductor layer doped with N-type impurities. The diffusion layer 13 and the core layer 12 may have opposite conductivity types. In some embodiments, a P-N junction may be formed between the diffusion layer 13 and the core layer 12. The impurity concentration of the diffusion layer 13 may be higher than the impurity concentration of the core layer 12. As such, the diffusion layer 13 is denoted as an "N+" region in FIG. 2.

The diffusion layer 13 may include a plurality of diffusion regions 14 separated from each other. The diffusion regions 14 and the diffusion layer 13 may have opposite conductivity types. In some embodiments, a P-N junction may be formed between each of the diffusion regions 14 and the diffusion layer 13. The impurity concentration of the diffusion regions 14 may be higher than the impurity concentration of the diffusion layer 13. As such, the diffusion regions 14 are designated as "P+" regions in FIG. 2.

In some embodiments, the thickness H1 of the substrate 10 of the semiconductor structure 2 may be in a range from about 240 μm to about 260 μm. In some embodiments, the thickness H2 of the groove ring 10r (e.g., the longest distance from the surface 102 to the bottom of the groove ring 10r) may be in a range from about 80 μm to about 120 μm. In some embodiments, the thickness H2 of the groove ring 10r may be in a range from about 30% to about 50% of the thickness H1 of the substrate 10.

In some embodiments, the electrode layer 16 of the semiconductor structure 2 may contact or cover the polysilicon layer 17. For example, a portion of the polysilicon layer 17 may be located between the surface 102 and the electrode layer 16 in a direction perpendicular to the surface 102. For example, in the direction perpendicular to the surface 102, the polysilicon layer 17 and the electrode layer 16 may partially overlap. In some embodiments, the electrode layer 16 of the semiconductor structure 2 may contact the glass layer 18. However, in some embodiments, the electrode layer 16 of the semiconductor structure 2 may also be coplanar with the polysilicon layer 17 as shown in FIG. 1. Similarly, in some embodiments, the polysilicon layer 17 and the electrode layer 16 of the semiconductor structure 1 may partially overlap in the direction perpendicular to the surface 102 as shown in FIG. 2.

Figure 3A:
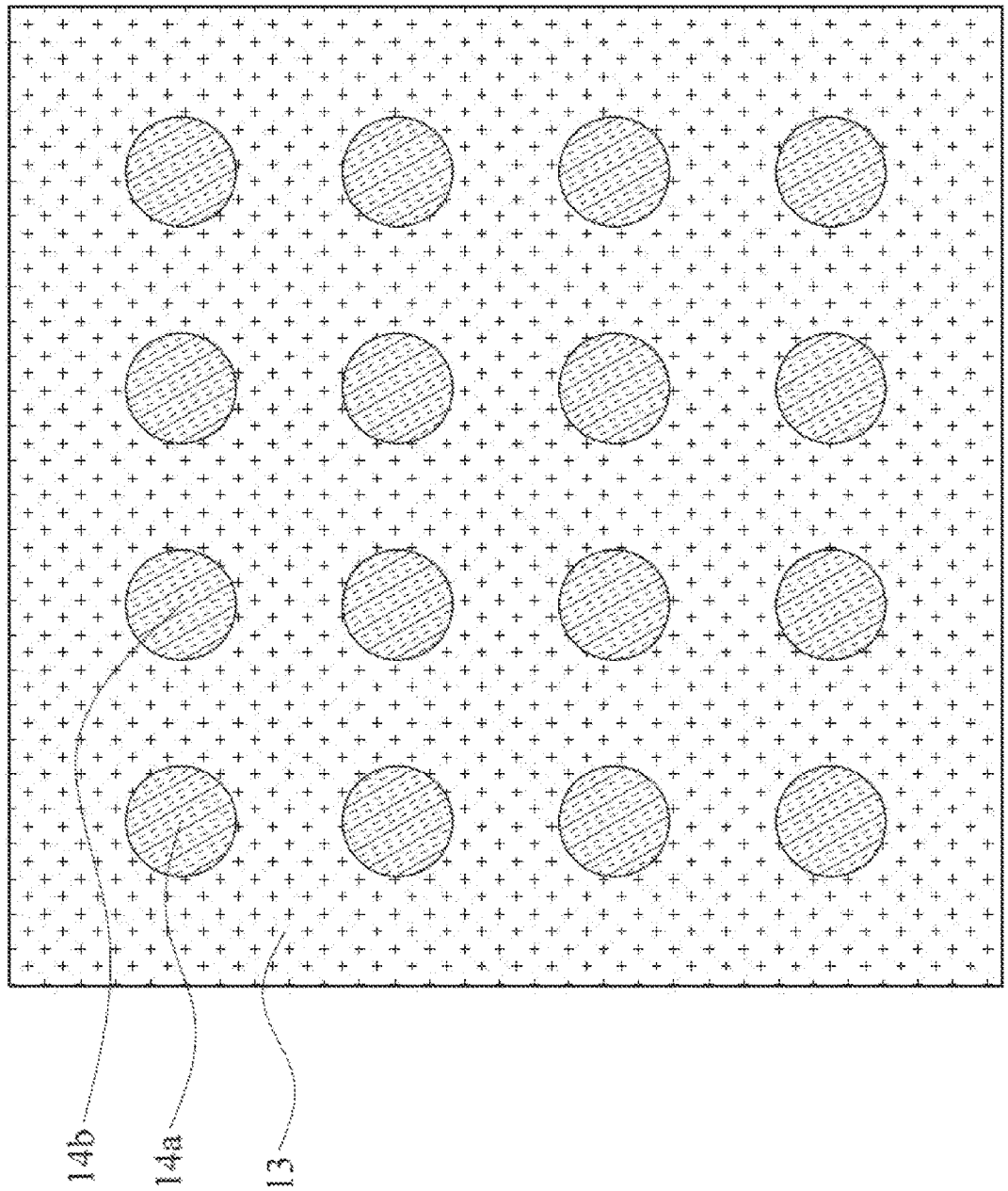
FIG. 3A shows a top view of the semiconductor structure in accordance with various embodiments of the present disclosure.
Figure 3B:
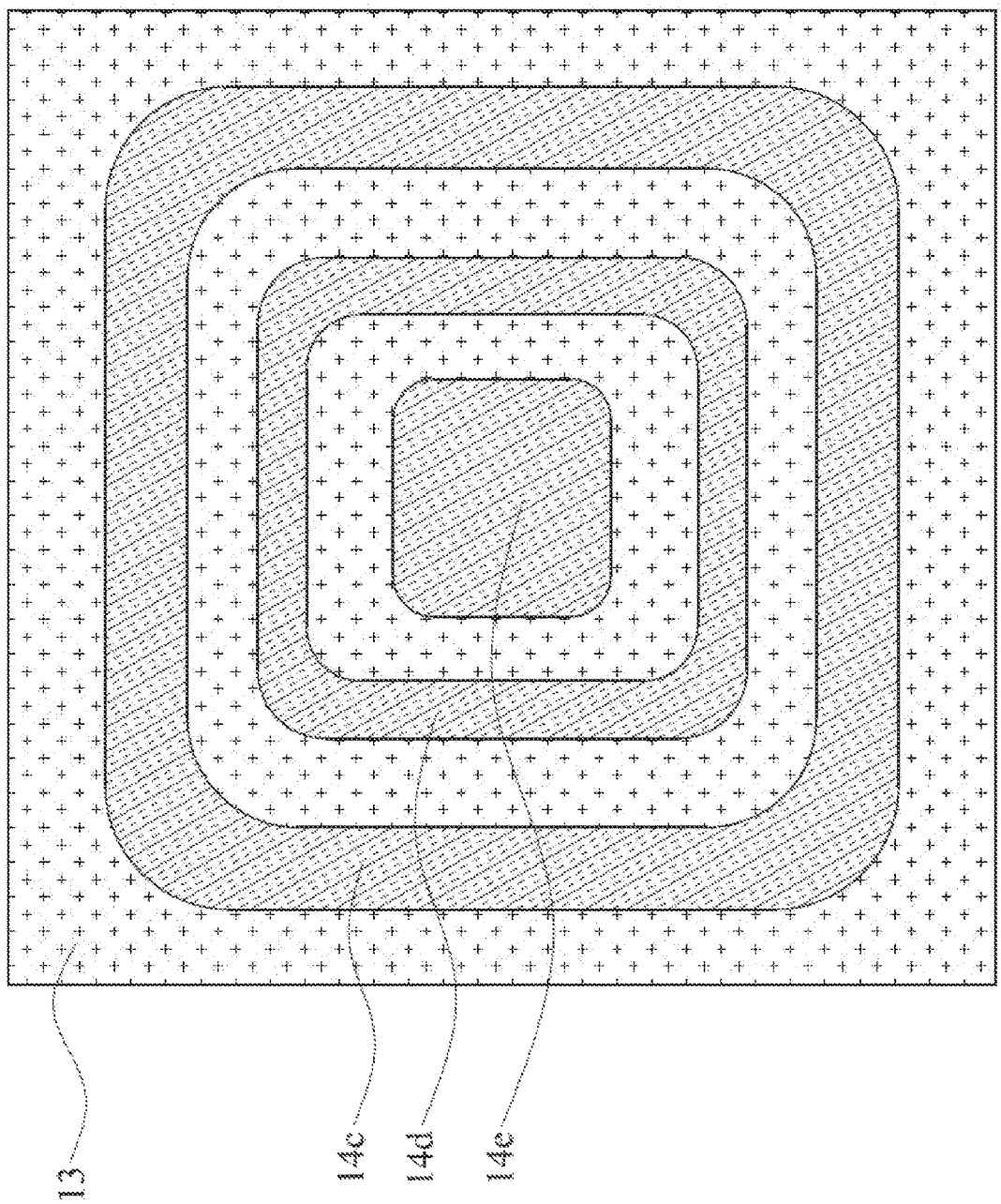
FIG. 3B shows another top view of the semiconductor structure in accordance with various embodiments of the present disclosure.
Figure 3C:
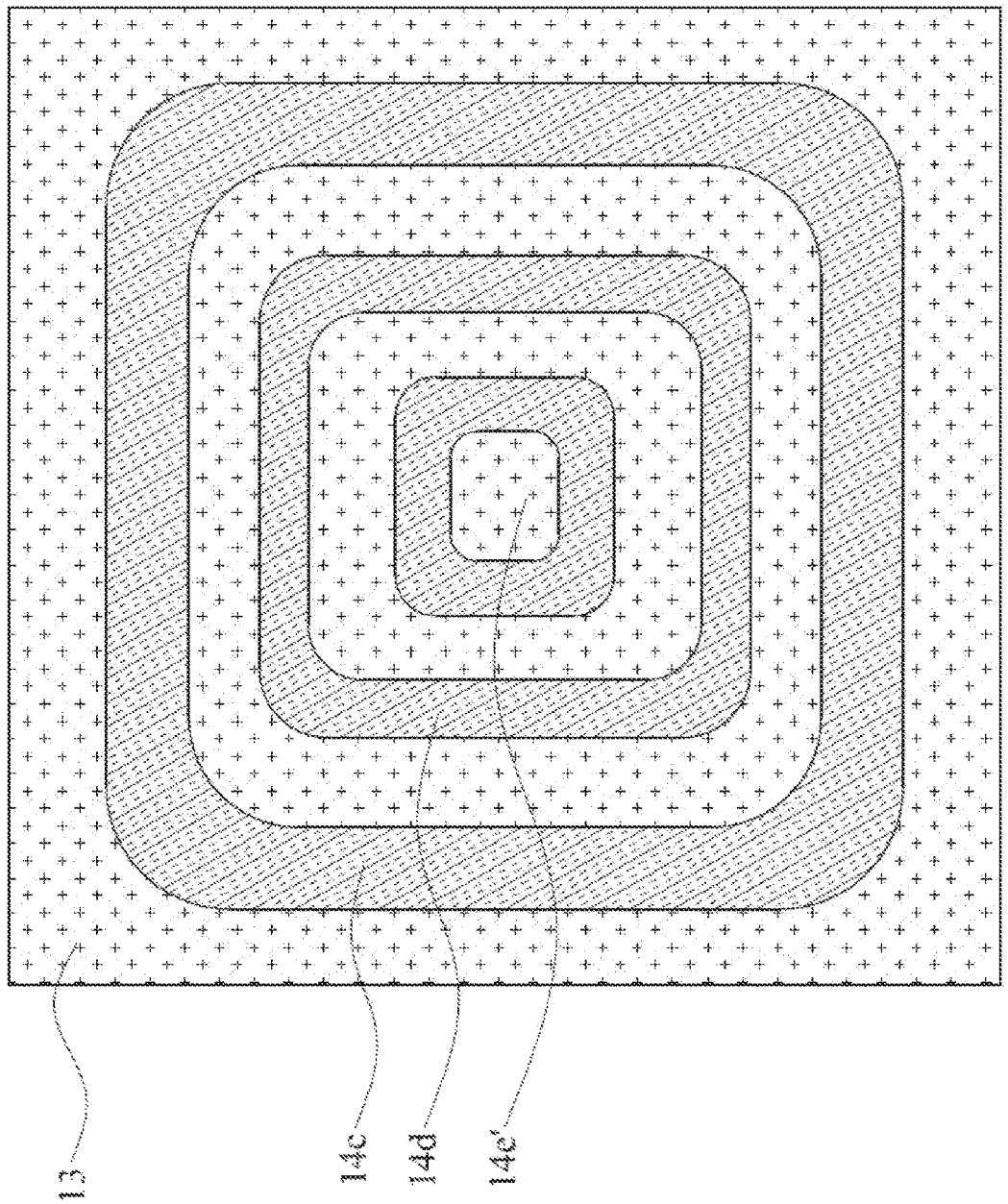
FIG. 3C shows another top view of the semiconductor structure in accordance with various embodiments of the present disclosure.

Referring to FIGS. 3A-3C, FIGS. 3A-3C are top views of the semiconductor structures in accordance with various embodiments of the present disclosure. In some embodiments, the semiconductor structure 1 and the semiconductor structure 2 may have a top view shown in any of FIGS. 3A-3C.

As shown in FIG. 3A, in some embodiments, diffusion regions (e.g., diffusion regions 14 of the semiconductor structure 1 and the semiconductor structure 2) may include diffusion regions 14a and 14b that are separated from each other. In some embodiments, the diffusion regions including diffusion regions 14a and 14b may be arranged in a matrix. Although the drawings of the present disclosure depict a matrix having four columns and four rows, the semiconductor structures of the present disclosure may also have diffusion regions arranged in a matrix of any number of columns or rows.

In some embodiments, the diffusion regions including diffusion regions 14a and 14b may be circular or quasi-circular (e.g., oval) in shape. However, the semiconductor structure of the present disclosure can also have diffusion regions of any shape.

As shown in FIG. 3B, in some embodiments, diffusion regions (e.g., diffusion regions 14 of the semiconductor structure 1 and the semiconductor structure 2) may include diffusion regions 14c, 14d, and 14e that are separated from each other. The diffusion region 14e may be located in the central region of the diffusion layer 13. The diffusion region 14e may be a rounded rectangle. The diffusion region 14d may surround the diffusion region 14e. The diffusion region 14c may surround the diffusion region 14d. In some embodiments, the diffusion regions 14c, 14d and 14e are concentric structures.

FIG. 3C is similar to FIG. 3B except that the diffusion region 14e' is located in the central region. As shown in FIG. 3C, the diffusion region 14e' is not solid.

In some embodiments, the position, shape, area ratio, quantity, etc. of the diffusion regions can be adjusted so that the diffusion regions can be applicable to different circuits.

Referring to FIGS. 4A-4H, FIGS. 4A-4H show one or more stages in a method of fabricating the semiconductor structure in accordance with various embodiments. At least some of these figures have been simplified to facilitate a better understanding of the primary aspects of the present disclosure.

Figure 4A:
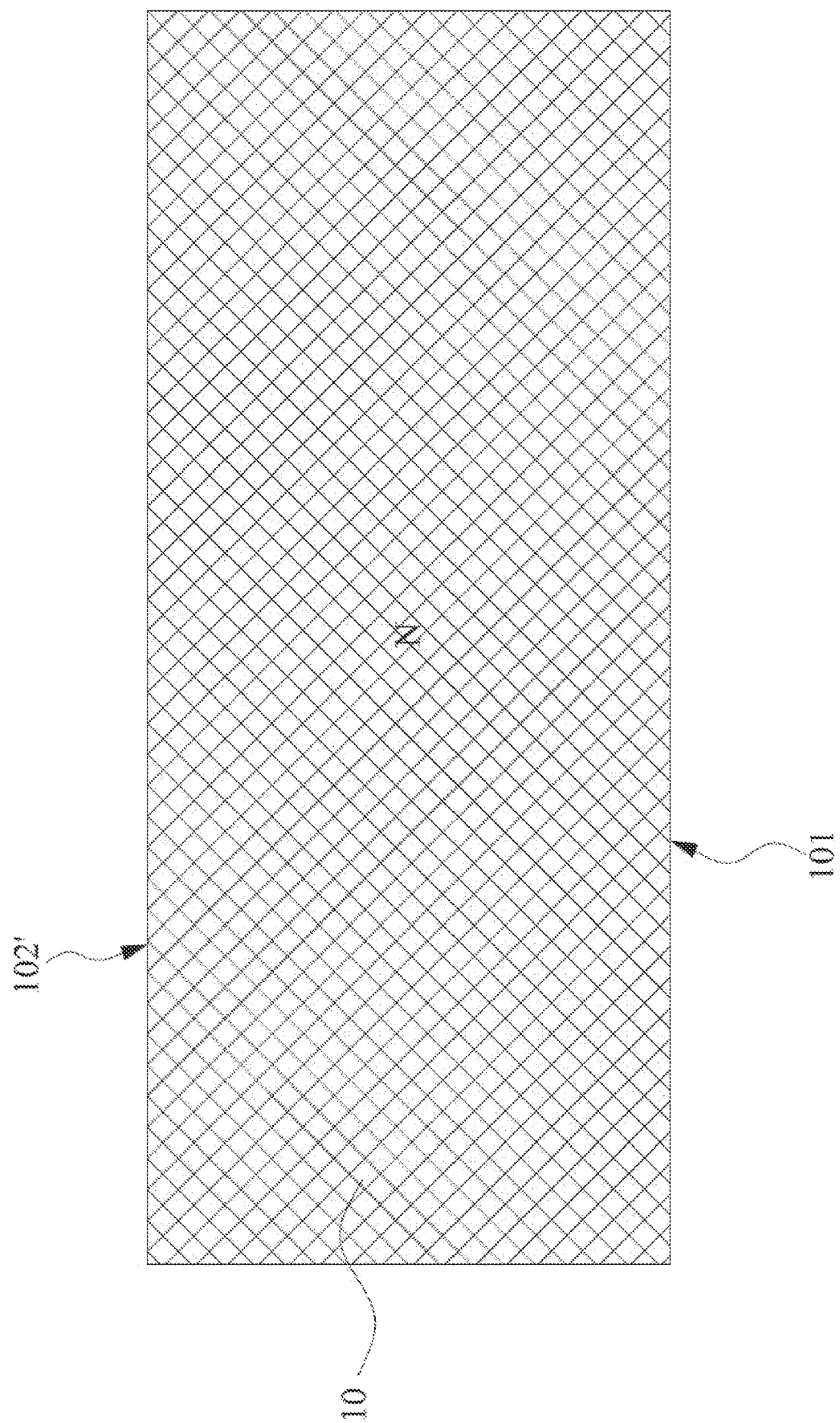
FIGS. 4A-4I show one or more stages in a method of fabricating the semiconductor structure in accordance with various embodiments.

Referring to FIG. 4A, the manufacturing method includes providing a substrate 10. The substrate 10 may include a semiconductor substrate doped with N-type or P-type impurities. In the embodiments shown in FIGS. 4A to 4I and the following description, an N-type silicon wafer is used as an example. In some embodiments, the thickness of the substrate 10 may be in a range from about 350 μm to about 370 μm. In some embodiments, N-type silicon wafers with volume resistivity in a range from about 30 Ohm-cm to about 45 Ohm-cm may be used. The substrate 10 may have a surface 101 and a surface 102' opposite to the surface 101.

Figure 4B:
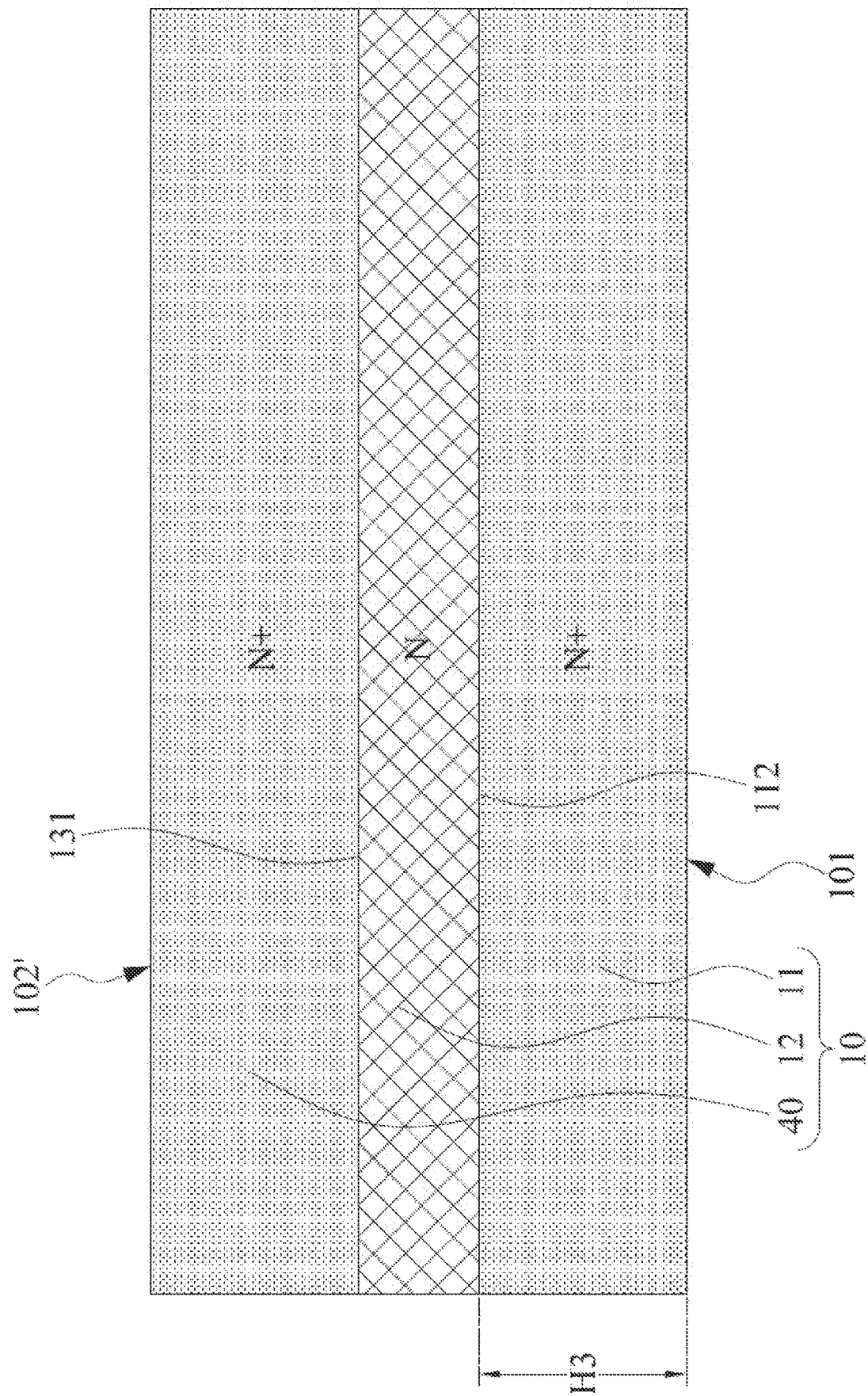

Referring to FIG. 4B, N-type impurities are diffused into the substrate 10 from the surface 101 and the surface 102' of the substrate 10 using a double-sided diffusion technique. The double-sided diffusion may include an N-type impurity pre-deposition step and an N-type impurity main diffusion step. Phosphorus is selected as an example to illustrate this technique. Phosphorus oxychloride ($POCl_3$) can be used as the phosphorus source for the pre-deposition step. The pre-deposited substrate 10 is then subjected to the main diffusion step to advance the diffusion boundary and form a deeper N+ layer. The substrate 10 is double-diffused to form an N+/N/N+ structure including a diffusion layer 40 adjacent to the surface 102', a core layer 12 and a diffusion layer 11 adjacent to the surface 101. In some embodiments, the thickness (or diffusion depth) H3 of the diffusion layer 40 and the diffusion layer 11 may be about 120 km.

If a P-type silicon wafer is used as the substrate 10, P-type impurities can be diffused into the substrate 10 from the surface 101 and the surface 102' of the substrate 10. The double-sided diffusion may include a P-type impurity pre-deposition step and a P-type impurity main diffusion step. Boron is selected as an example to illustrate this technique. For example, boron trichloride ($BCl_3$) can be used for the pre-deposition step as the source of boron. The pre-deposited substrate 10 is then subjected to a main diffusion step to advance the diffusion boundary and form a deeper P+ layer. The P+/P/P+ structure is formed after the substrate 10 is diffused on both sides.

Figure 4C:
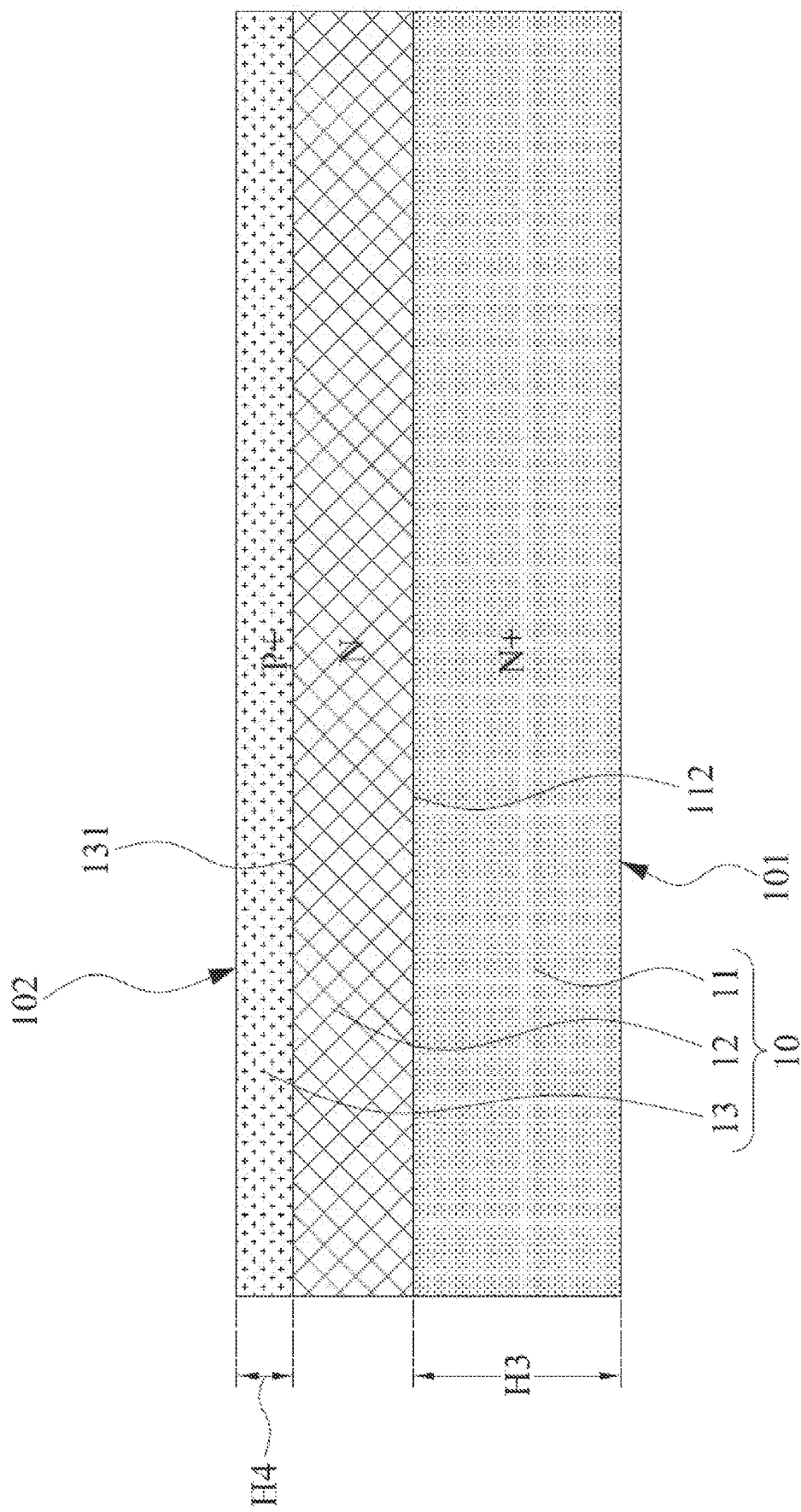

Referring to FIG. 4C, a grinding process and a polishing process are performed on the substrate 10 from the surface 102' to remove a portion of the diffusion layer 40. As a result, the thickness H4 of the diffusion layer 40 is reduced to about 20 μm. After the grinding process and the polishing process have been performed on the substrate 10, the substrate 10 has a new surface 102. After that, P-type impurities are diffused into the substrate 10 from the surface 102. The diffusion process may include a P-type impurity pre-deposition step and a P-type impurity main diffusion step. Boron is selected as an example to illustrate this technique. For example, boron trichloride ($BCl_3$) can be used for the pre-deposition step as the source of boron. The pre-deposited substrate 10 is then subjected to the main diffusion step to invert the remaining diffusion layer 40 from N-type to P-type. After the substrate 10 is diffused, a P+/N/N+ structure is formed. The P+/N/N+ structure includes a diffusion layer 13 adjacent to the surface 102, the core layer 12 and the diffusion layer 11 adjacent to the surface 101. In some embodiments, the grinding process and the polishing process may be performed on the substrate 10 to completely remove the diffusion layer 40. As a result, the core layer 12 is exposed. After that, P-type impurities are diffused into the core layer 12 to invert a portion of the core layer 12 from N-type to P-type.

If a P-type silicon wafer is used as the substrate 10, N-type impurities can be diffused from the surface 102 of the substrate 10 (diffusion layer 40 is partially removed) or from the core layer 12 (diffusion layer 40 is completely removed). The diffusion process may include an N-type impurity pre-deposition step and an N-type impurity main diffusion step. Phosphorus is selected as an example to illustrate this technique. For example, phosphorus oxychloride ($POCl_3$) can be used as the phosphorus source for the pre-deposition step. The main diffusion is then performed on the pre-deposited substrate 10 to invert the remaining diffusion layer 40 or a portion of the core layer 12 from P-type to N-type.

Figure 4D:
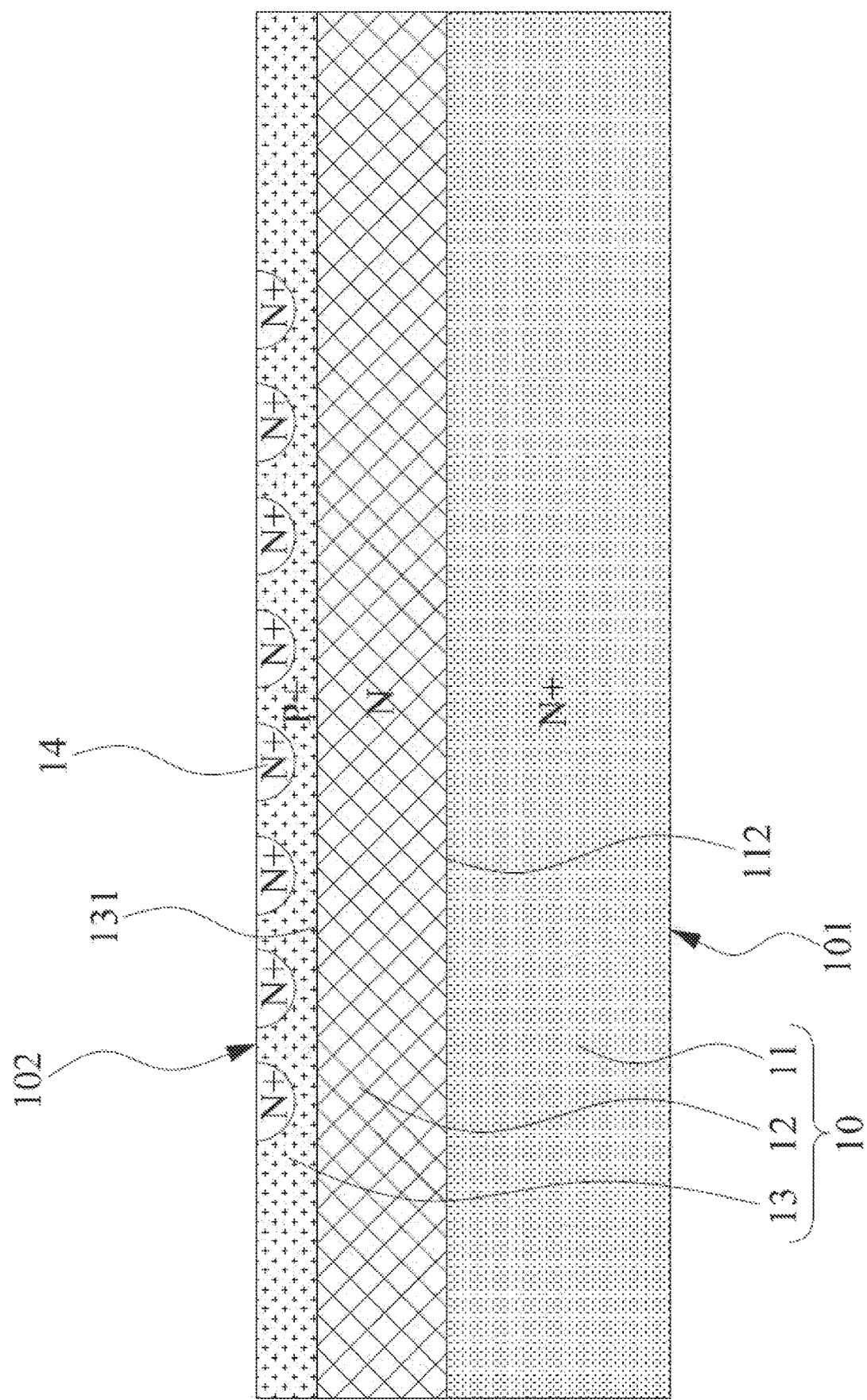

Referring to FIG. 4D, a base mask (not shown) is formed on the surface 102 of the substrate 10. The base mask may have a plurality of openings to define the diffusion regions 14 (the N+ regions 14). The base mask can define the location of the P-N junction. For example, the base mask can define both the base and the emitter. After that, N-type impurities are diffused from the surface 102 of the substrate 10 to form a plurality of diffusion regions 14 separated from each other in the diffusion layer 13. Phosphorus is selected as an example to illustrate this technique. Phosphorus oxychloride ($POCl_3$) can be used as the source of phosphorus. The base mask can block phosphorus from diffusing into the diffusion layer 13. The base mask can be removed by etching, stripping, or other suitable processes.

If a P-type silicon wafer is used as the substrate 10, boron trichloride ($BCl_3$) can be used as a source of boron to form a plurality of P+ regions separated from each other in the diffusion layer 13.

Figure 4E:
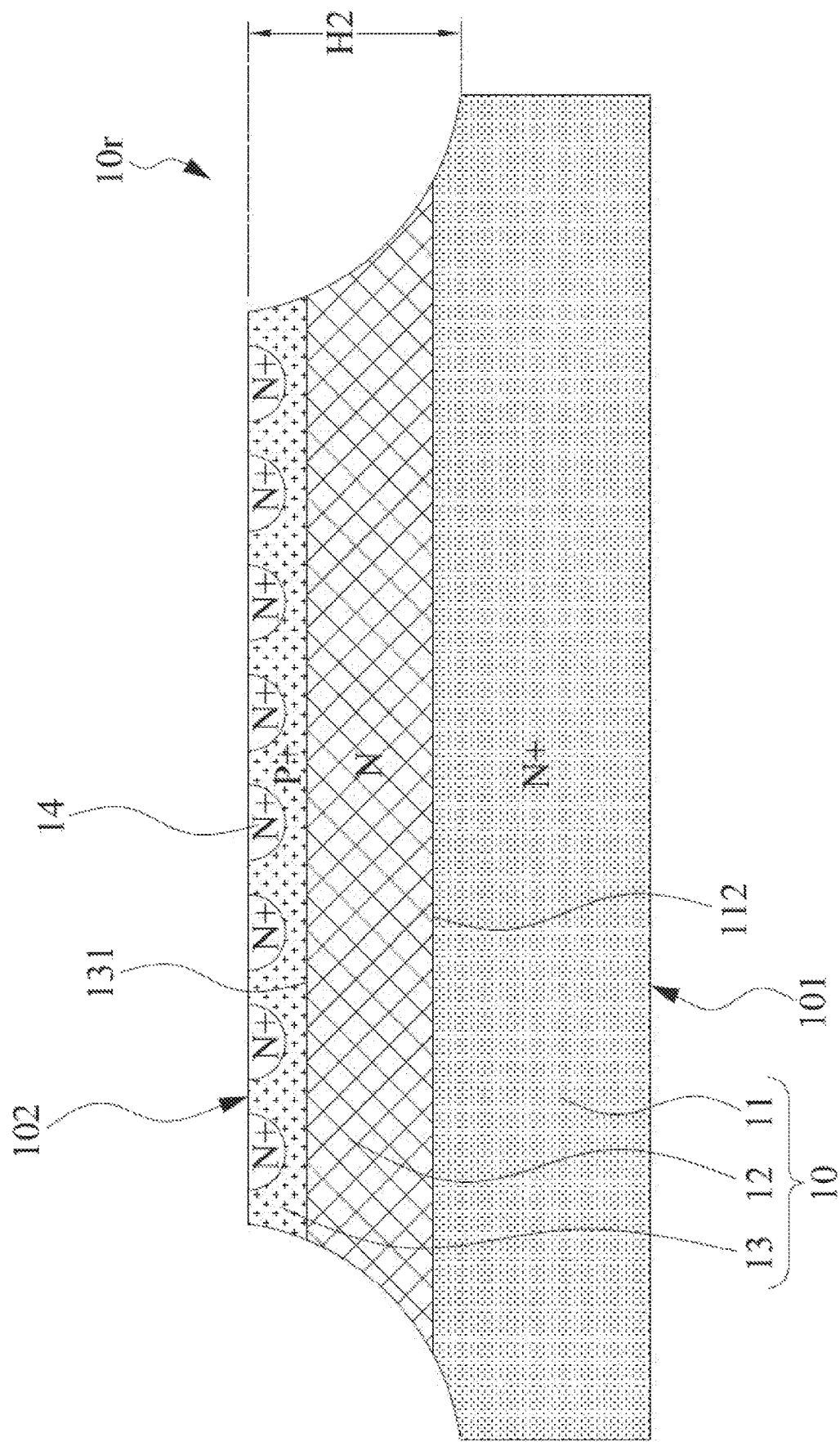

Referring to FIG. 4E, a mesa mask (not shown) is formed on the surface 102 of the substrate 10. The mesa mask may have openings to define the location of the groove ring 10r. The mesa mask is used to form a mesa area surrounded by the groove ring 10r. A chemically etched region is formed in the substrate 10 by photolithography techniques such as gluing, exposure and development. The chemically etched region is subjected to solution etching to form the groove ring 10r. The groove ring 10r may extend to the diffusion layer 11. In some embodiments, the thickness H2 of groove ring 10r (e.g., the longest distance from surface 102 to the bottom of groove ring 10r) may be about 80 μm. The mesa mask can be removed by etching, lift-off, or other suitable processes.

Figure 4F:
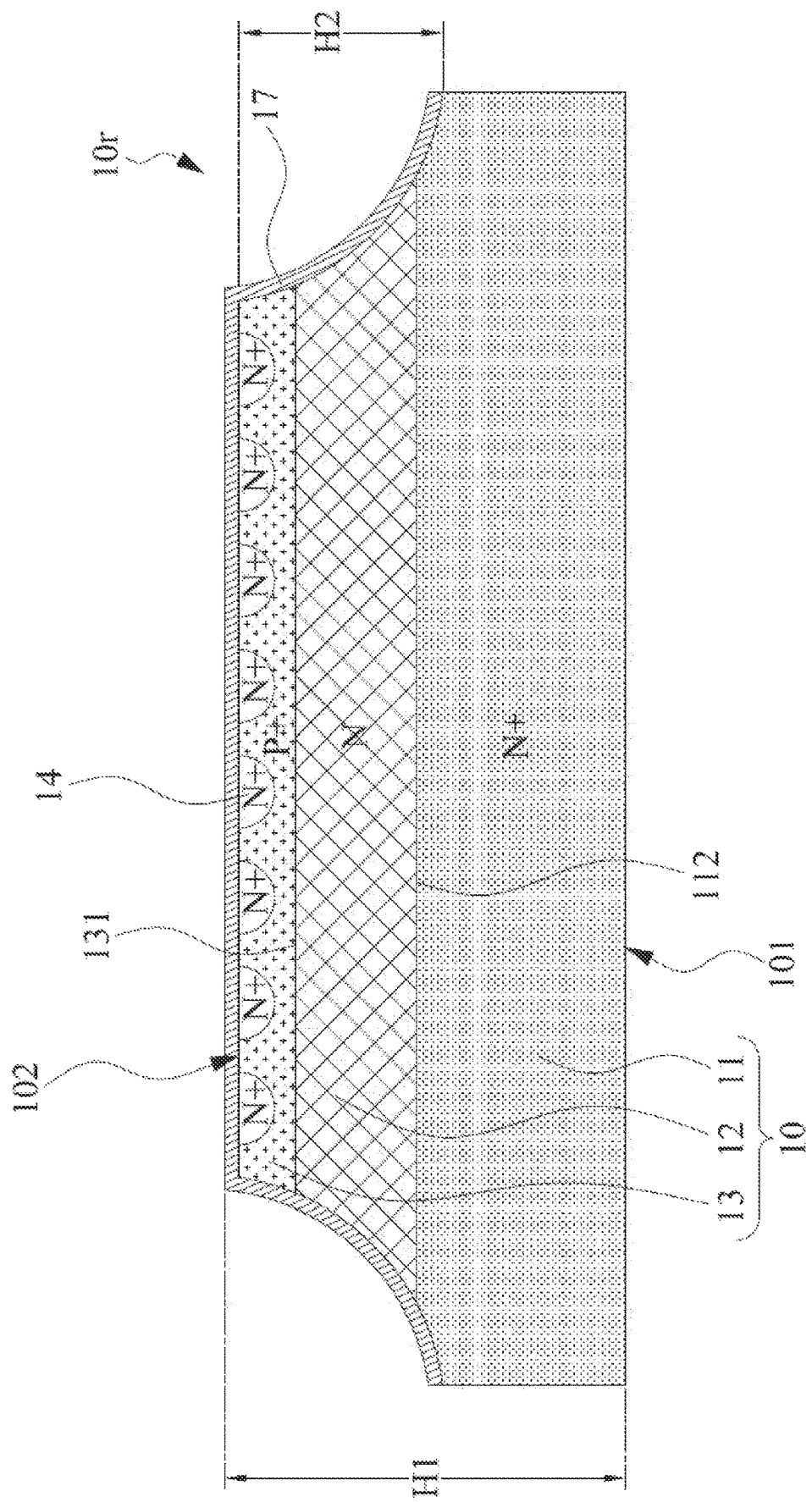

Referring to FIG. 4F, a polysilicon layer 17 is formed over the groove ring 10r. In some embodiments, the polysilicon layer 17 may be formed by a SIPOS deposition process.

Figure 4G:
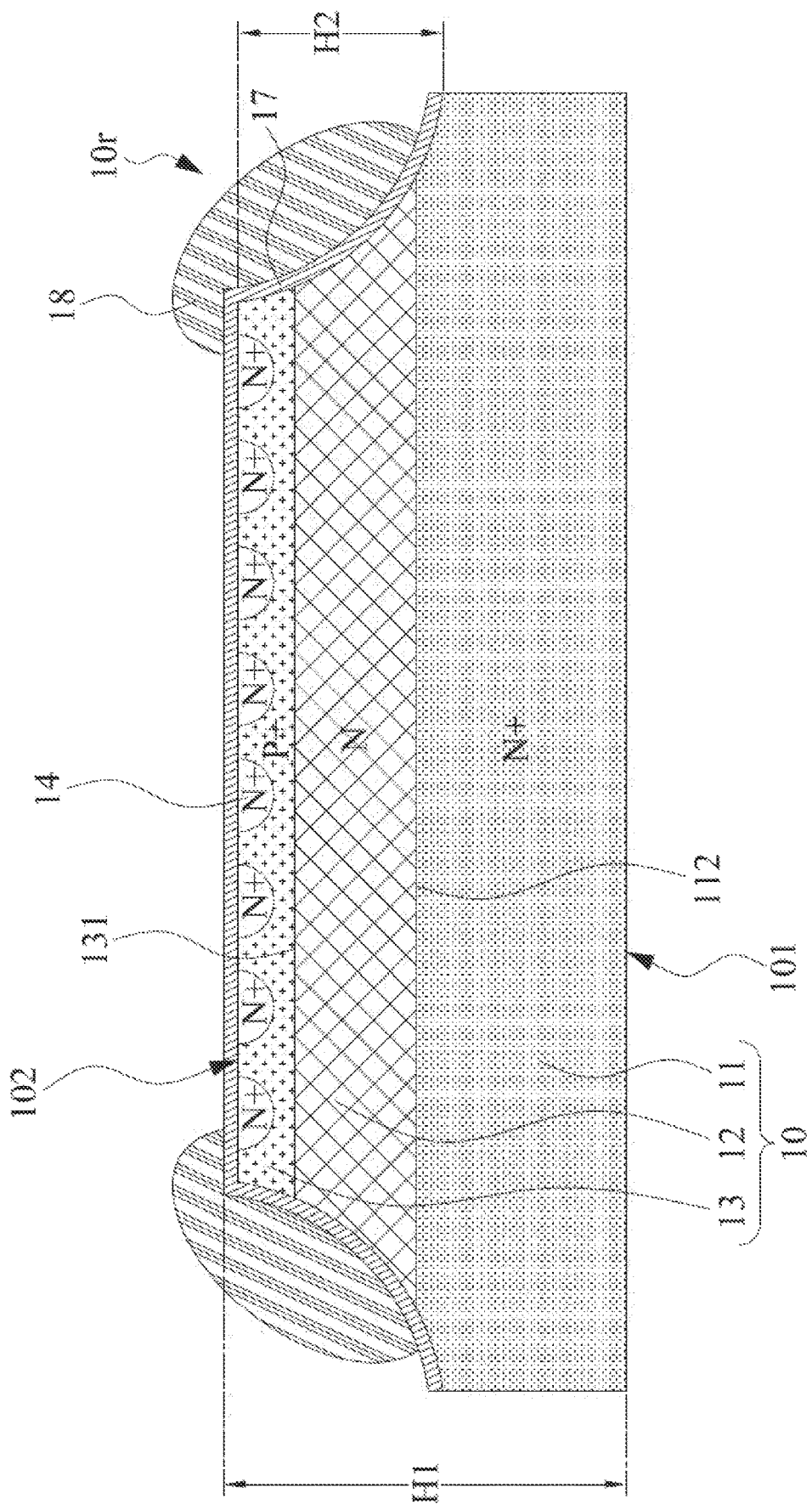

Referring to FIG. 4G, a glass layer is formed in the groove ring 10r and on the polysilicon layer 17. In some embodiments, the glass layer may be coated on substrate 10. In some embodiments, a photoresist liquid may be incorporated into the glass liquid to form a photoresist liquid glass, which may be coated on the substrate 10. In some embodiments, a glass mask (not shown) is formed on the surface 102 of the substrate 10. The glass mask may have openings to define the location of the glass layer 18. A portion of the glass layer may be removed, and the glass layer 18 may be formed using photolithography techniques and a firing process. After the portions of the glass layer have been removed, the polysilicon layer 17 on surface 102 is exposed from glass layer 18. The glass mask can be removed by etching, lift-off, or other suitable processes.

Figure 4H:
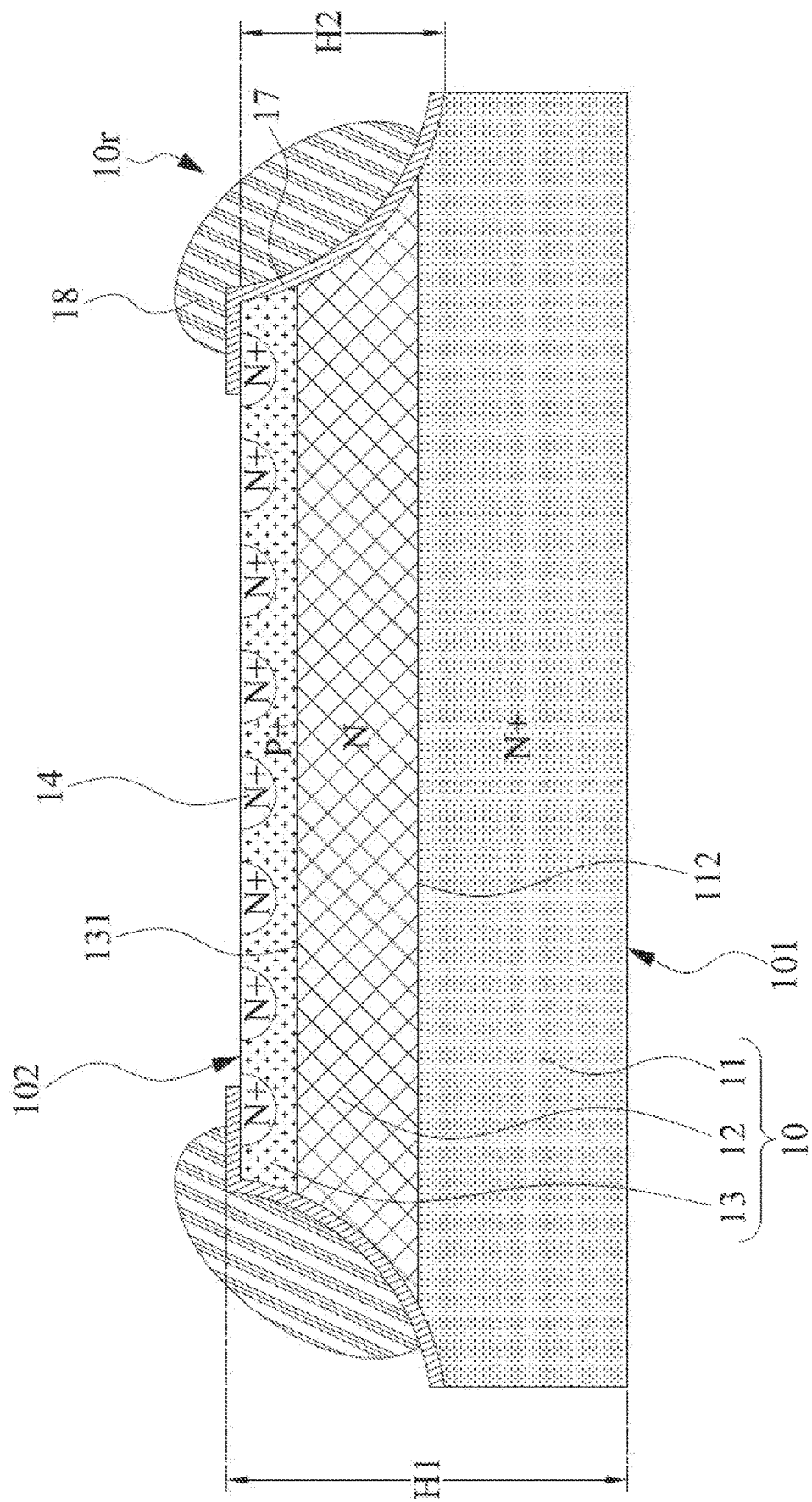

Referring to FIG. 4H, a contact mask (optionally, not shown in the figure) is formed on the polysilicon layer 17. The contact mask may have openings to define the opening size of the polysilicon layer 17. A portion of the polysilicon layer 17 exposed from the glass layer 18 on the surface 102 can be removed using the photolithography techniques to expose a portion of the diffusion layer 13 and a portion of the diffusion regions 14. The exposed diffusion layer 13 and the exposed diffusion regions 14 will be in direct contact with a conductive contact structure formed thereon. The conductive contact structure is the electrode layer 16. In this embodiment, a portion of the polysilicon layer 17 remains on the surface 102. The contact mask can be removed by etching, lift-off or other suitable processes.

In some embodiments, the opening size of the polysilicon layer 17 may be directly defined by the glass layer 18 without using a contact mask. In other words, the polysilicon layer 17 exposed from the glass layer 18 on the surface 102 can be completely removed by the photolithography techniques.

Figure 4I:
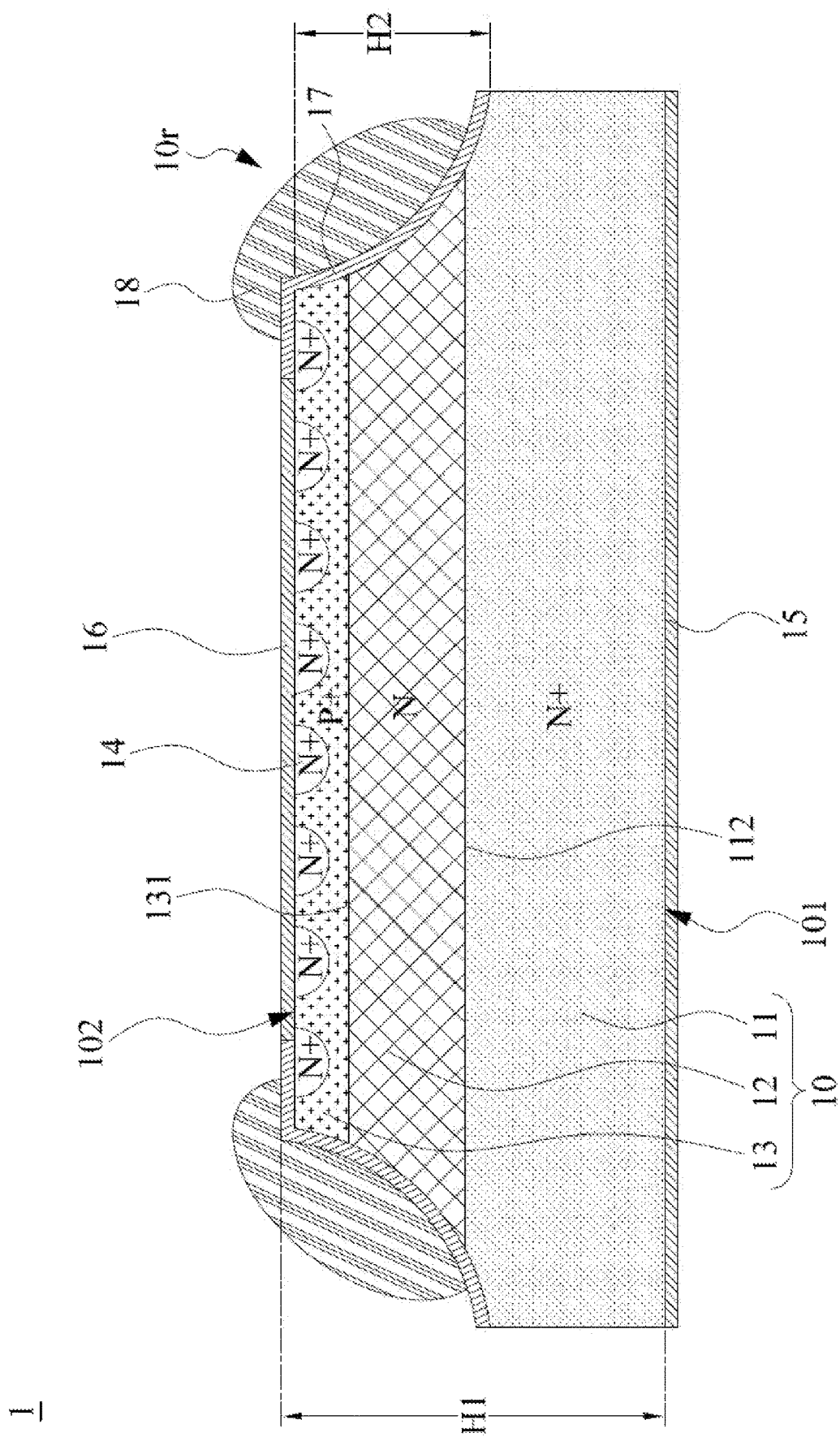

Referring to FIG. 4I, the electrode layer 15 and the electrode layer 16 are formed on the surface 101 and the surface 102 through a metal mask (not shown in the figure), respectively. The diffusion layer 13 (equivalent to the base) and the diffusion region 14 (each of which is equivalent to the emitter) are shorted together. In this configuration, the substrate 10 is sandwiched between the electrode layer 15 and the electrode layer 16. In some embodiments, the electrode layer 15 and the electrode layer 16 may be formed by sputtering, electroless plating, electroplating, printing, or other suitable processes. In some embodiments, the electrode layer 16 is not deposited on the polysilicon layer 17 (as shown in FIG. 1). In some embodiments, the electrode layer 16 may be deposited on the polysilicon layer 17 (as shown in FIG. 2). The metal mask can be removed by etching, lift-off, or other suitable processes. The semiconductor structure formed by the above steps can be the same as the semiconductor structure 1 shown in FIG. 1 or the semiconductor structure 2 shown in FIG. 2.

The manufacturing method of the semiconductor structure of the present application can realize the NPN or PNP transistor without using the existing BJT process, and during the forward conduction, the PN junction mainly plays the role of conducting current. During the turn-on and the turn-off processes, due to the impact of current and voltage, the NPN or PNP switch acts to reduce the oscillation in the circuit and improve the efficiency. Adjusting the ratio of the effective areas occupied by N+ or P+ according to different applications can make the structure suitable for different applications. As mentioned above, the fabrication method of the semiconductor structure of the present application uses four or five masks, including a base mask, a mesa mask, a glass mask, a contact mask (optionally) and a metal mask. Compared with the BJT manufacturing method (usually requiring at least six or seven masks), the present case requires fewer masks, so the manufacturing process is simplified and the cost is lower.

Spatially relative terms such as "below," "below," "lower," "above," "upper," "left," "right," etc. may be used herein for ease of description. The terms are used to describe the relationship between one component or feature and another component or feature in the drawings. In addition to the orientation depicted in the figures, spatially relative terms are intended to encompass different orientations of the device in use or operation. The device may be otherwise oriented (rotated 90 degrees or at other orientations) and the spatially relative descriptors used herein may likewise be interpreted in a corresponding manner. It will be understood that when a component is referred to as being "connected" or "coupled" to another component, it can be directly connected or coupled to the other component or intervening components may be present.

As used herein, the terms "substantially" and "about" are used to describe and explain small variations. When used in conjunction with an event or circumstance, the terms can refer to both instances in which the event or circumstance occurs precisely as well as instances in which the event or circumstance occurs approximately. As used herein with respect to a given value or range, the term "about" generally means within ±10%, ±5%, ±1%, or ±0.5% of the given value or range. A range may be expressed herein as one endpoint to another endpoint or between two endpoints. All ranges disclosed herein are inclusive of the endpoints unless otherwise indicated. The term "substantially coplanar" may mean that two surfaces are positioned along the same plane within a few micrometers (m), such as within 10 μm, 5 μm, 1 μm, or 0.5 μm along the same plane. When values or properties are referred to as being "substantially" the same, the term can refer to values within ±10%, ±5%, ±1%, or ±0.5% of the mean of the stated value.

The foregoing has outlined features of several embodiments and detailed aspects of the present disclosure. The embodiments described in this disclosure may be readily utilized as a basis for designing or modifying other processes and structures for carrying out the same or similar purposes and/or achieving the same or similar advantages of the embodiments described herein. Such equivalent constructions do not depart from the spirit and scope of the present disclosure, and without departing from the spirit and scope of the present disclosure, various changes, substitutions and alterations may be made.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
a substrate having a first conductivity type, and having a first surface and a second surface opposite to the first surface;
a first diffusion layer having the first conductivity type, wherein the first diffusion layer is disposed in the substrate and adjacent to the first surface;
a first electrode layer disposed on the first diffusion layer;
a second diffusion layer having a second conductivity type, wherein the second diffusion layer is disposed in the substrate and adjacent to the second surface;
a plurality of diffusion regions having the first conductivity type and disposed in the second diffusion layer, wherein a first conductivity type impurity concentration of the plurality of diffusion regions is higher than a second conductivity type impurity concentration of the second diffusion layer; and
a second electrode layer disposed on the second diffusion layer and in contact with the plurality of diffusion regions, wherein:
the second diffusion layer is coupled to the plurality of diffusion regions through the second electrode layer; and
the substrate is between the first electrode layer and the second electrode layer.

2. The semiconductor structure of claim 1, wherein:
the first conductivity type impurity concentration of the first diffusion layer is higher than the first conductivity type impurity concentration of the substrate.

3. The semiconductor structure of claim 1, wherein:
the plurality of diffusion regions is exposed from the second surface of the substrate; and
the plurality of diffusion regions is covered by the second electrode layer.

4. The semiconductor structure of claim 1, wherein:
each of the plurality of diffusion regions has a surface coplanar with the second surface of the substrate; and
the plurality of diffusion regions does not extend to a diffusion boundary of the second diffusion layer, and wherein a distance between the plurality of diffusion regions and the diffusion boundary of the second diffusion layer is greater than about 15 microns.

5. The semiconductor structure of claim 1, wherein:
the plurality of diffusion regions comprise a first diffusion region and a second diffusion region separated from the first diffusion region.

6. The semiconductor structure of claim 5, wherein:
the first diffusion region surrounds the second diffusion region.

7. The semiconductor structure of claim 1, wherein:
the plurality of diffusion regions is arranged in a matrix.

8. The semiconductor structure of claim 1, further comprising:
a square groove ring formed in the substrate.

9. The semiconductor structure of claim 8, wherein:
the square groove ring extends downwardly from the second surface of the substrate beyond a diffusion boundary of the first diffusion layer.

10. The semiconductor structure of claim 8, further comprising:
a glass layer disposed on the square groove ring.

11. The semiconductor structure of claim 10, wherein:
the glass layer covers a portion of the second surface and surrounds the second electrode layer.

12. The semiconductor structure of claim 10, further comprising:
a polysilicon layer disposed between the glass layer and the square groove ring.

13. The semiconductor structure of claim 12, wherein:
the polysilicon layer extends toward the second electrode layer and contacts an edge of the second electrode layer; and
the polysilicon layer partially covers at least one of the plurality of diffusion regions.

14. An apparatus comprising:
a first diffusion layer formed on a first electrode layer;
a core layer formed over the first diffusion layer;
a second diffusion layer formed over the core layer;
a plurality of diffusion regions formed in the second diffusion layer;
a second electrode layer formed over the second diffusion layer and in contact with the plurality of diffusion regions;
a square groove ring extending from the second electrode layer down to a diffusion boundary of the first diffusion layer;
a glass layer formed over the square groove ring; and
a polysilicon layer formed between the glass layer and the square groove ring.

15. The apparatus of claim 14, wherein:
the second diffusion layer is coupled to the plurality of diffusion regions through the second electrode layer.

16. The apparatus of claim 14, wherein:
the plurality of diffusion regions comprise a first diffusion region and a second diffusion region separated from the first diffusion region, and wherein:
the second diffusion region is rectangular in shape; and
the first diffusion region surrounds the second diffusion region.

17. An apparatus comprising:
a substrate having a first surface, a first diffusion layer, a core layer over the first diffusion layer, a second diffusion layer over the core layer and a second surface opposite to the first surface, wherein the first diffusion layer and the core layer have a first conductivity type, and the second diffusion layer has a second conductivity type;
a plurality of diffusion regions having the first conductivity type in the second diffusion layer;
a first electrode layer on the first diffusion layer;
a second electrode layer on the second diffusion layer, wherein the second electrode layer is in contact with the plurality of diffusion regions;
a groove ring formed in the substrate;
a glass layer disposed on the square groove ring; and
a polysilicon layer disposed between the glass layer and the groove ring.

18. The apparatus of claim 17, wherein:
the first diffusion layer is a collector of a transistor;
the second diffusion layer is a base of the transistor; and
the plurality of diffusion regions is an emitter of the transistor, and wherein the second diffusion layer and the plurality of diffusion region are short-circuited to each other to achieve a diode element through short-circuiting the base and the emitter of the transistor.

19. The apparatus of claim 17, wherein:
the first electrode layer is in direct contact with the first diffusion layer, and the second electrode layer is in direct contact with the second diffusion layer, and wherein a width of the first electrode layer is greater than a width of the second electrode layer;
the groove ring has an arc surface when viewed in a cross-sectional view, and a rectangular shape when viewed from a top view, and wherein the groove ring extends from the second surface of the substrate down beyond a diffusion boundary between the first diffusion layer and the core layer; and
the polysilicon layer covers an edge portion of the second surface of the substrate and partially covers at least one diffusion region.

* * * * *